United States Patent
Harada et al.

(10) Patent No.: US 6,507,482 B2
(45) Date of Patent: Jan. 14, 2003

(54) CHIP TYPE SOLID ELECTROLYTIC CAPACITOR

(75) Inventors: Daisuke Harada, Toyama (JP); Masahiko Tanaka, Toyama (JP)

(73) Assignee: NEC Tokin Toyama, Ltd., Toyama (JP)

(*) Notice: Subject to any disclaimer, the term of this patent is extended or adjusted under 35 U.S.C. 154(b) by 0 days.

(21) Appl. No.: 09/987,015

(22) Filed: Nov. 13, 2001

(65) Prior Publication Data

US 2002/0089808 A1 Jul. 11, 2002

(30) Foreign Application Priority Data

Nov. 13, 2000 (JP) .......................... 2000-344910

(51) Int. Cl.[7] .......................... H01G 9/08; H01G 9/145
(52) U.S. Cl. .......................... 361/535; 361/532; 361/528
(58) Field of Search .................. 361/523–541

(56) References Cited

U.S. PATENT DOCUMENTS

| 4,814,947 | A | * | 3/1989 | Gunter | 361/540 |
| 5,461,539 | A | * | 10/1995 | Kuriyama | 174/52.2 |
| 5,805,413 | A | * | 9/1998 | Kurita | 361/272 |
| 6,188,566 | B1 | * | 2/2001 | Aoyama | 361/275.4 |
| 6,324,051 | B1 | * | 11/2001 | Igaki et al. | 29/25.03 |
| 6,333,844 | B1 | * | 12/2001 | Nakamura | 361/523 |
| 2002/0001167 | A1 | * | 1/2002 | Kida et al. | 361/508 |

FOREIGN PATENT DOCUMENTS

| JP | 59-151424 | 10/1984 |
| JP | 1-110424 | 7/1989 |
| JP | 8-125061 | 5/1996 |
| JP | 9-298256 | 11/1997 |

* cited by examiner

*Primary Examiner*—Dean A. Reichard
*Assistant Examiner*—Eric Thomas
(74) *Attorney, Agent, or Firm*—Young & Thompson

(57) ABSTRACT

There is provided a structure for mounting an electronic part, including (a) an electronic part in the form of a chip, (b) a resin block entirely covering the electronic part therewith, and (c) a pair of electrodes electrically connected to the electronic part and extending outwardly of the resin block, the electronic part being deviated in position in a direction relative to a center of the structure, the resin block being formed with a raised portion extending downwardly from a bottom surface of the resin block, the resin block having a tapered portion between a top surface of the raised portion and the bottom surface of the resin block in the direction.

5 Claims, 4 Drawing Sheets

CHIP TYPE SOLID ELECTROLYTIC CAPACITOR

BACKGROUND OF THE INVENTION

1. Field of the Invention

The invention relates to a chip type solid electrolytic capacitor, and more particularly to a shape of a resin block entirely covering a solid electrolytic capacitor device in a solid electrolytic capacitor.

2. Description of the Related Art

FIG. 1 is a cross-sectional view of a conventional chip type solid electrolytic capacitor.

As illustrated in FIG. 1, the conventional chip type solid electrolytic capacitor 30 is comprised of a chip type solid electrolytic capacitor device 31, a resin block 32 entirely covering the chip type solid electrolytic capacitor device 31 therewith, and a pair of electrodes 33a and 33b both electrically connected to the chip type solid electrolytic capacitor 31 and extending outwardly of the resin block 32.

An anode 34 extends outwardly from the chip type solid electrolytic capacitor device 31 to thereby electrically connect the chip type solid electrolytic capacitor device 31 and the electrode 33a to each other therethrough. The electrode 33b is electrically connected to the chip type solid electrolytic capacitor device 31 through solder 35.

The electrodes 33a and 33b have L-shaped bends, and further have a distal end located just beneath a bottom surface 32a of the resin block 32.

The resin block 32 is formed centrally with a raised portion 36 extending downwardly from the bottom surface 32a of the resin block 32, in order to prevent the chip type solid electrolytic capacitor device 31 from being exposed externally. The raised portion 36 has a rectangular cross-section, and has a height not beyond lower surfaces of the electrodes 33a and 33b. However, the raised portion 36 may have a height beyond the lower surfaces of the electrodes 33a and 33b.

As illustrated in FIG. 1, since the chip type solid electrolytic capacitor device 31 includes the anode 34, a center of the chip type solid electrolytic capacitor device 31 is deviated towards the right in FIG. 1 from a center of the resin block 32 by L/2 where L indicates a length of a portion of the anode 34 exposed out of the chip type solid electrolytic capacitor device 31. In other words, the chip type solid electrolytic capacitor device 31 is deviated towards a cathode (not illustrated) in the resin block 32.

As mentioned earlier, the raised portion 36 is formed centrally of the bottom surface 32a of the resin block 32 on the assumption that the chip type solid electrolytic capacitor device 31 is located centrally of the resin block 32.

Accordingly, if the chip type solid electrolytic capacitor device 31 were deviated towards a cathode in the resin block 32, there is caused a problem as follows.

As illustrated in FIG. 2, if the chip type solid electrolytic capacitor device 31 were mounted in the resin block 32 with being inclined obliquely, a corner 31a of the chip type solid electrolytic capacitor device 31 cannot be covered with the raised portion 36, resulting in that the corner 31a might be exposed outwardly of the bottom surface 32a of the resin block 32 at a place where the raised portion 36 is not formed.

The above-mentioned problem is caused also when the chip type solid electrolytic capacitor device 31 is larger in size than the resin block 32 and therefore the raised portion 36.

Japanese Unexamined Utility Model Publication No. 59-151424 has suggested a chip type electronic part including a device, a resin block covering the device therewith, and electrodes extending outwardly of the resin block to be electrically connected to a circuit by face-bonding. The resin block is formed at a bottom surface thereof with a raised portion extending downwardly to face the circuit. The chip type electronic part can stand by itself by virtue of the raised portion.

Japanese Unexamined Utility Model Publication No. 1-110424 has suggested a chip type capacitor including an electronic device, a resin block entirely covering the electronic device therewith, and metal terminals extending from the electronic device and bending towards the resin block to thereby be level with a bottom surface of the resin block.

Japanese Unexamined Patent Publication No. 8-125061 has suggested a semiconductor device including an electronic part, a resin block covering the electronic part therewith and having a surface from which a plurality of pins extend vertically, a pin protector having a part holder which holds the electronic part at a predetermined position in a holder space, the pin protector having a surface formed with a first hole through which the pins are exposed, and further having another surface a second hole through which the pin projects with the resin block making contact with an inner wall of the first hole, thereby allowing the pin to be inserted into a hole formed through a wiring substrate.

Japanese Unexamined Patent Publication No. 9-298256 has suggested an electronic part including an electronic device, a lead electrically connected to the electronic device, and a resin block covering the electronic device and the lead therewith. A side surface of the lead is formed at a lower end of a side surface of the resin block when the side surface of the resin block is cut out, and is exposed in the same plane with the side surface of the resin block.

However, the above-mentioned problem remains unsolved even in those Publications.

SUMMARY OF THE INVENTION

In view of the above-mentioned problem in the prior art, it is an object of the present invention to provide a chip type solid electrolytic capacitor and a structure for mounting an electronic part both of which can prevent a chip type solid electrolytic capacitor device, in particular, a corner thereof from being exposed outwardly of a resin block, even when the chip type solid electrolytic capacitor device is loaded in the resin block with being obliquely inclined.

In one aspect of the present invention, there is provided a structure for mounting an electronic part, including (a) an electronic part in the form of a chip, (b) a resin block entirely covering the electronic part therewith, and (c) a pair of electrodes electrically connected to the electronic part and extending outwardly of the resin block, the electronic part being deviated in position in a direction relative to a center of the structure, the resin block being formed with a raised portion extending downwardly from a bottom surface of the resin block, the resin block having a tapered portion between a top surface of the raised portion and the bottom surface of the resin block in the direction.

In the above-mentioned structure, the resin block is designed to have a tapered portion between a top surface of the raised portion (corresponding to the raised portion 36 in FIG. 1) and a bottom surface (corresponding to the bottom surface 32a of the resin block 32 in FIG. 1) of the resin block. Accordingly, even if a chip type electronic part is mounted in the resin block with being obliquely inclined, a corner (corresponding to the corner 31a in FIG. 2) of the chip type electronic part remains shielded in the tapered portion of the resin block, preventing that the chip type electronic part is exposed outwardly of the resin block.

There is further provided a structure for mounting an electronic part, including (a) an electronic part in the form of a chip, (b) a resin block entirely covering the electronic part therewith, and (c) a pair of electrodes electrically connected to the electronic part and extending outwardly of the resin block, the electronic part being deviated in position in a direction relative to a center of the structure, the resin block being formed with a raised portion extending downwardly from a bottom surface of the resin block, the raised portion having a length beyond an end of the electronic part in the direction.

In the above-mentioned structure, the raised portion (corresponding to the raised portion 36 in FIG. 1) is designed to have a length beyond an end of the electronic part in a direction in which the electronic part is deviated. Accordingly, even if a chip type electronic part is mounted in the resin block with being obliquely inclined, a corner (corresponding to the corner 31a in FIG. 2) of the chip type electronic part remains shielded in the raised portion of the resin block, preventing that the chip type electronic part is exposed outwardly of the resin block.

There is still further provided a solid electrolytic capacitor including (a) a solid electrolytic capacitor device in the form of a chip, (b) a resin block entirely covering the solid electrolytic capacitor device therewith, and (c) a pair of electrodes electrically connected to the solid electrolytic capacitor device and extending outwardly of the resin block, the solid electrolytic capacitor device being deviated in position in a direction relative to a center of the solid electrolytic capacitor, the resin block being formed with a raised portion extending downwardly from a bottom surface of the resin block, the resin block having a tapered portion between a top surface of the raised portion and the bottom surface of the resin block in the direction.

In the above-mentioned solid electrolytic capacitor, the resin block is designed to have a tapered portion between a top surface of the raised portion (corresponding to the raised portion 36 in FIG. 1) and a bottom surface (corresponding to the bottom surface 32a of the resin block 32 in FIG. 1) of the resin block. Accordingly, even if a chip type solid electrolytic capacitor device is mounted in the resin block with being obliquely inclined, a corner (corresponding to the corner 31a in FIG. 2) of the chip type solid electrolytic capacitor device remains shielded in the tapered portion of the resin block, preventing that the chip type solid electrolytic capacitor device is exposed outwardly of the resin block.

There is yet further provided a solid electrolytic capacitor including (a) a solid electrolytic capacitor device in the form of a chip, (b) a resin block entirely covering the solid electrolytic capacitor device therewith, and (c) a pair of electrodes electrically connected to the solid electrolytic capacitor device and extending outwardly of the resin block, the solid electrolytic capacitor device being deviated in position in a direction relative to a center of the solid electrolytic capacitor, the resin block being formed with a raised portion extending downwardly from a bottom surface of the resin block, the raised portion having a length beyond an end of the solid electrolytic capacitor device in the direction.

In the above-mentioned solid electrolytic capacitor, the raised portion (corresponding to the raised portion 36 in FIG. 1) is designed to have a length beyond an end of the chip type solid electrolytic capacitor device in a direction in which the chip type solid electrolytic capacitor device is deviated. Accordingly, even if a chip type solid electrolytic capacitor device is mounted in the resin block with being obliquely inclined, a corner (corresponding to the corner 31a in FIG. 2) of the chip type solid electrolytic capacitor device remains shielded in the raised portion of the resin block, preventing that the chip type solid electrolytic capacitor device is exposed outwardly of the resin block.

For instance, the direction may be defined as a direction in which the solid electrolytic capacitor device has its cathode.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3:
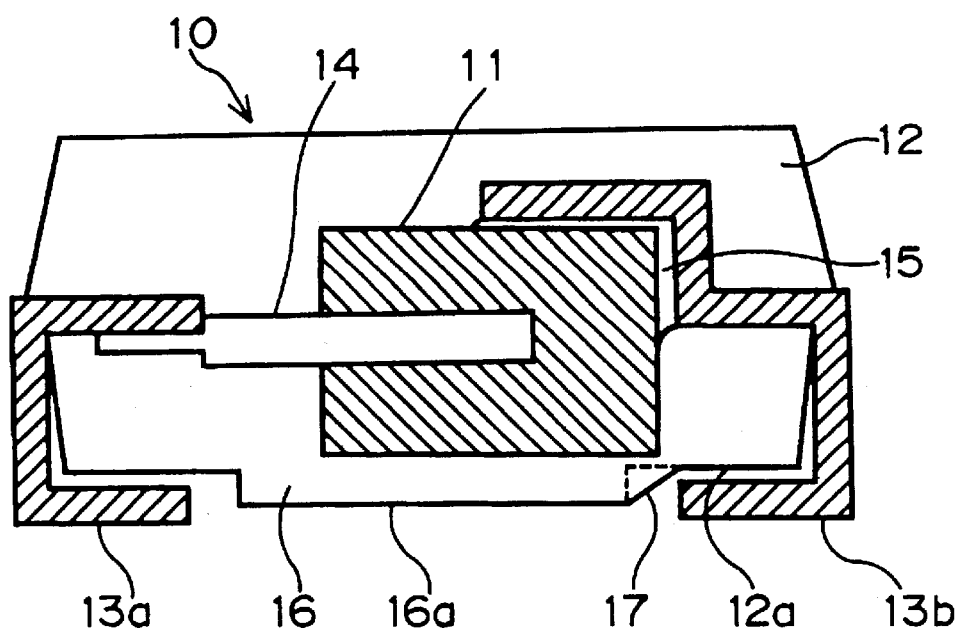
FIG. 3 is a cross-sectional view of the conventional chip type solid electrolytic capacitor.

FIG. 3 is a cross-sectional view of a chip type solid electrolytic capacitor 10 in accordance with the first embodiment of the present invention.

As illustrated in FIG. 3, the chip type solid electrolytic capacitor 10 is comprised of a chip type solid electrolytic capacitor device 11, a resin block 12 entirely covering the chip type solid electrolytic capacitor device 11 therewith, and a pair of electrodes 13a and 13b both electrically connected to the chip type solid electrolytic capacitor 11 and extending outwardly of the resin block 12.

An anode 14 extends outwardly from the chip type solid electrolytic capacitor device 11 to thereby electrically connect the chip type solid electrolytic capacitor device 11 and the electrode 13a to each other therethrough. The electrode 13b is electrically connected to the chip type solid electrolytic capacitor device 11 through solder 15.

The electrodes 13a and 13b have L-shaped bends, and further have a distal end located just beneath a bottom surface 12a of the resin block 12.

The resin block 12 is formed at a bottom surface 12a thereof centrally with a raised portion 16 extending downwardly from the bottom surface 12a. The raised portion 16 has a rectangular cross-section, and has a height not beyond lower surfaces of the electrodes 13a and 13b. However, the raised portion 16 may have a height beyond the lower surfaces of the electrodes 13a and 13b.

Since the chip type solid electrolytic capacitor device 11 includes the anode 14, a center of the chip type solid electrolytic capacitor device 11 is deviated towards the right in FIG. 3 from a center of the resin block 12 by L/2 where L indicates a length of a portion of the anode 14 exposed out of the chip type solid electrolytic capacitor device 11. In other words, the chip type solid electrolytic capacitor device 11 is deviated towards a cathode (not illustrated) in the resin block 12.

In accordance with the first embodiment, in order to absorb the deviation of the chip type solid electrolytic capacitor device 11, the raised portion 16 is designed to have a tapered portion 17 between a top surface 16a of the raised portion 16 and a bottom surface 12a of the resin block 12 in the right in FIG. 3, that is, at the side of a cathode of the chip type solid electrolytic capacitor device 11.

As mentioned above, the chip type solid electrolytic capacitor 10 is designed to have the tapered portion 17 between the top surface 16a of the raised portion 16 and the bottom surface 12a of the resin block 12.

Figure 2:
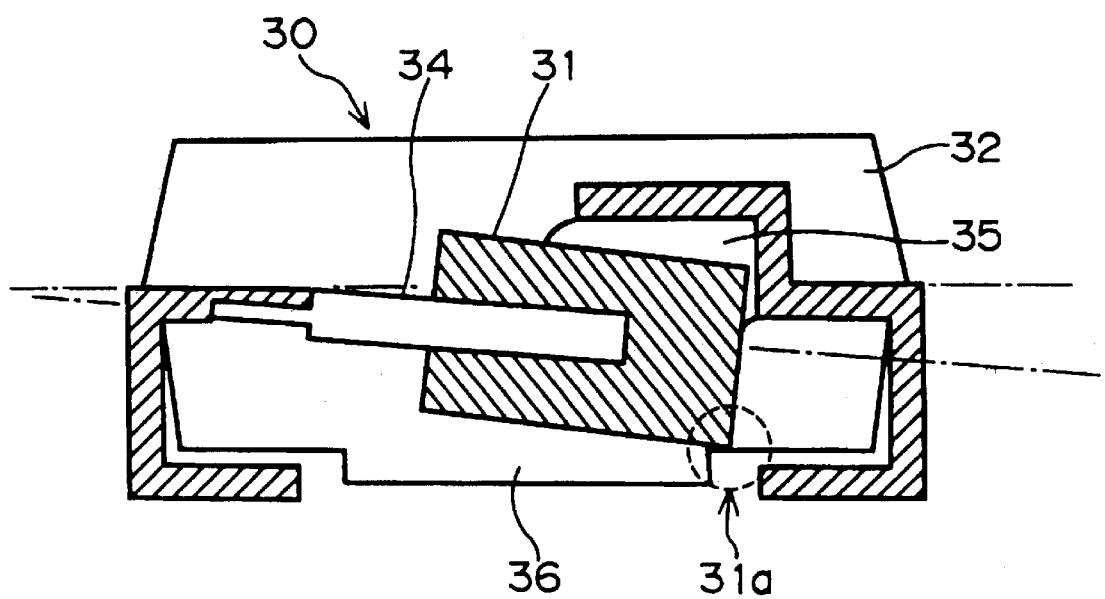
FIG. 2 is a cross-sectional view of the chip type solid electrolytic capacitor in accordance with the second embodiment of the present invention.

Accordingly, even if the chip type solid electrolytic capacitor device 11 is mounted in the resin block 12 with being obliquely inclined, as shown in FIG. 2, a corner (corresponding to the corner 31a in FIG. 2) of the chip type solid electrolytic capacitor device 11 remains shielded in the tapered portion 17 of the resin block 12, ensuring that the chip type solid electrolytic capacitor device 11 is prevented from being exposed outwardly of the resin block 12.

Figure 4:
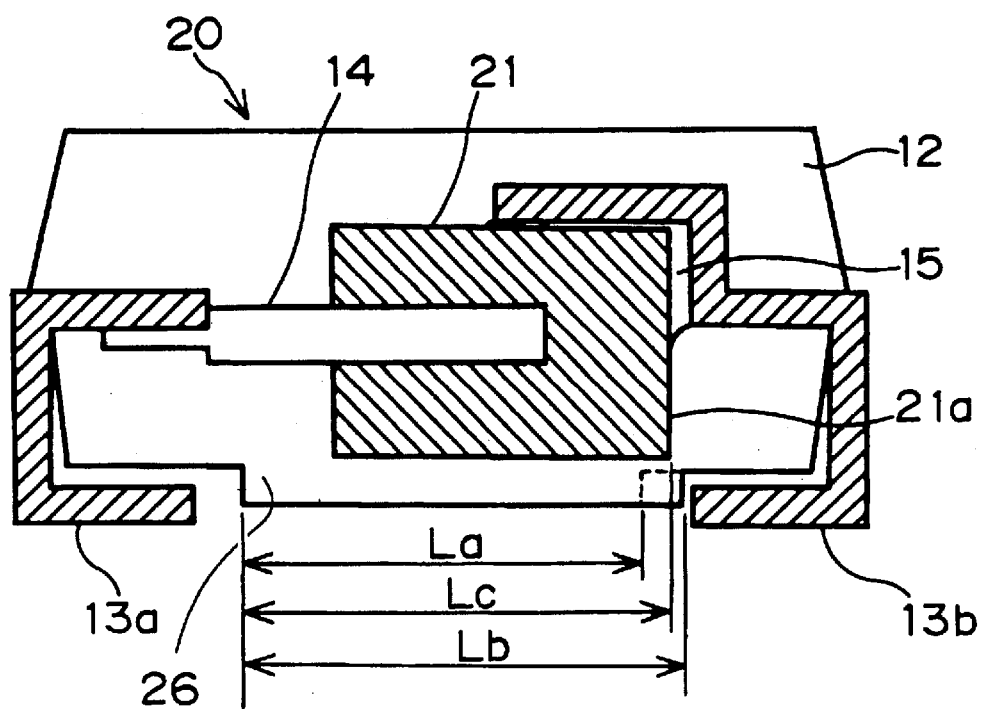
FIG. 4 is a cross-sectional view of the conventional chip type solid electrolytic capacitor illustrated in FIG. 3, with a solid electrolytic capacitor device being obliquely inclined.

FIG. 4 is a cross-sectional view of a chip type solid electrolytic capacitor 20 in accordance with the second embodiment of the present invention.

The chip type solid electrolytic capacitor 20 in accordance with the second embodiment is designed to have a raised portion 26 having a length longer than a length of the raised portion 16 in accordance with the first embodiment, in place of the tapered portion 17 of the resin block 12 in the first embodiment.

The chip type solid electrolytic capacitor 20 has the same structure as the structure of the chip type solid electrolytic capacitor 10 except the above-mentioned replacement of tapered portion 17 with the raised portion 26.

Specifically, the raised portion 26 in the chip type solid electrolytic capacitor 20 is designed to have a length beyond an end 21a of a chip type solid electrolytic capacitor device 21 in a direction in which the chip type solid electrolytic capacitor device 21 is deviated, that is, at the side of a cathode of the chip type solid electrolytic capacitor device 21.

Hereinbelow is explained a relation in length between the raised portion 26 and the chip type solid electrolytic capacitor device 21, with reference to FIG. 4.

Figure 1:
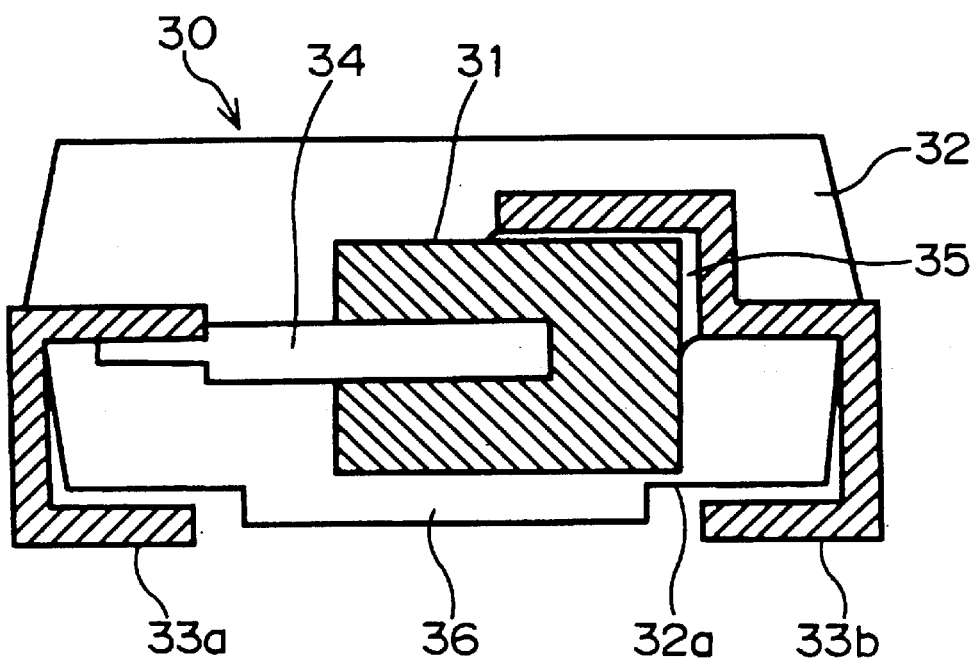
FIG. 1 is a cross-sectional view of the chip type solid electrolytic capacitor in accordance with the first embodiment of the present invention.

It is assumed that La indicates a horizontal length of the raised portion 36 in the conventional chip type solid electrolytic capacitor 30 illustrated in FIG. 1, Lc indicates a horizontal length from a left end of the raised portion 26 to the right end 21a of the chip type solid electrolytic capacitor device 21, and Lb indicates a horizontal length of the raised portion 26 in the chip type solid electrolytic capacitor 20 in accordance with the second embodiment.

As is obvious in view of FIG. 4, the length La is greater than the length Lc, which is greater than the length Lb.

La<Lc<Lb

As mentioned above, the raised portion 26 is designed to have a length beyond the end 21a of the chip type solid electrolytic capacitor device 21 at the side of a cathode of the chip type solid electrolytic capacitor device 21. That is, the raised portion 26 is longer than the raised portion 36 in the conventional chip type solid electrolytic capacitor 30 by a length (Lb−La).

Accordingly, even if the chip type solid electrolytic capacitor device 21 is mounted in the resin block 12 with being obliquely inclined, as shown in FIG. 2, a corner (corresponding to the corner 31a in FIG. 2) of the chip type solid electrolytic capacitor device 21 remains shielded in the raised portion 26 having an extended length relative to the raised portion 36 of the conventional chip type solid electrolytic capacitor 30, ensuring that the chip type solid electrolytic capacitor device 21 is prevented from being exposed outwardly of the resin block 12.

The inventors had conducted the following experiment in order to verify the advantages presented by the chip type solid electrolytic capacitors 10 and 20 in accordance with the above-mentioned first and second embodiments.

In the experiment, the conventional chip type solid electrolytic capacitors 30 illustrated in FIG. 1 were fabricated by the number of 100, the chip type solid electrolytic capacitors 10 in accordance with the first embodiment, illustrated in FIG. 3, were fabricated by the number of 100, and the chip type solid electrolytic capacitors 20 in accordance with the second embodiment, illustrated in FIG. 4, were fabricated by the number of 100. Each of the chip type solid electrolytic capacitors had a chip type solid electrolytic capacitor device having a length of 2.0 mm and a height of 1.25 mm.

Then, it was checked through visual observation as to whether each of the chip type solid electrolytic capacitors was exposed outwardly of the resin block.

The results of checking are shown in Table 1.

TABLE 1

|  | Exposed | Not Exposed |
| --- | --- | --- |
| Conventional | 9 | 91 |
| 1st Embodiment | 2 | 98 |
| 2nd Embodiment | 1 | 99 |

As is understood in view of Table 1, a rate at which a chip type solid electrolytic capacitor device is exposed outwardly of a resin block is 9% in the conventional chip type solid electrolytic capacitor 30, whereas the same is 2% and 1% in the chip type solid electrolytic capacitors 10 and 20 in accordance with the first and second embodiments, respectively.

In accordance with the results of the experiment, it was found out that the chip type solid electrolytic capacitors 10 and 20 in accordance with the first and second embodiments could make it possible to prevent the chip type solid electrolytic capacitor devices 11 and 21 from being exposed outwardly of the resin block 12, more effectively than the conventional chip type solid electrolytic capacitor 30.

Though the present invention is applied to the chip type solid electrolytic capacitors 10 and 20 in the first and second embodiments, respectively, it should be noted that the present invention might be applied to any electronic parts, if they are mounted in a resin block in a deviated condition from a center of the resin block.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-344910 filed on Nov. 13, 2000 including specification, claims, drawings and summary is incorporated herein by reference in its entirety.

What is claimed is:

1. A structure for mounting an electronic part, comprising:
(a) an electronic part in the form of a chip;
(b) a resin block entirely covering said electronic part therewith; and
(c) a pair of electrodes electrically connected to said electronic part and extending outwardly of said resin block,
said electronic part being deviated in position in a direction relative to a center of said structure,
said resin block being formed with a raised portion extending downwardly from a bottom surface of said resin block,
said resin block having a tapered portion between a top surface of said raised portion and said bottom surface of said resin block in said direction.

2. A solid electrolytic capacitor comprising:
(a) a solid electrolytic capacitor device in the form of a chip;
(b) a resin block entirely covering said solid electrolytic capacitor device therewith; and
(c) a pair of electrodes electrically connected to said solid electrolytic capacitor device and extending outwardly of said resin block,
said solid electrolytic capacitor device being deviated in position in a direction relative to a center of said solid electrolytic capacitor,
said resin block being formed with a raised portion extending downwardly from a bottom surface of said resin block,
said resin block having a tapered portion between a top surface of said raised portion and said bottom surface of said resin block in said direction.

3. The solid electrolytic capacitor as set forth in claim 2, wherein said direction is defined as a direction in which said solid electrolytic capacitor device has its cathode.

4. A solid electrolytic capacitor comprising:
(a) a solid electrolytic capacitor device in the form of a chip;
(b) a resin block entirely covering said solid electrolytic capacitor device therewith; and
(c) a pair of electrodes electrically connected to said solid electrolytic capacitor device and extending outwardly of said resin block,
said solid electrolytic capacitor device being deviated in position in a direction relative to a center of said solid electrolytic capacitor,
said resin block being formed with a raised portion extending downwardly from a bottom surface of said resin block,
said raised portion having a tapered length extending beyond an end of said solid electrolytic capacitor device in said direction.

5. The solid electrolytic capacitor as set forth in claim 4, wherein said direction is defined as a direction in which said solid electrolytic capacitor device has its cathode.

* * * * *